United States Patent [19]
Smithson et al.

[11] Patent Number: 5,654,873
[45] Date of Patent: Aug. 5, 1997

[54] SINGLE CONNECTOR ATTACHMENT DRIVE SLED ASSEMBLY HAVING LIGHT PIPE COUPLED TO A RAIL

[75] Inventors: Stephen D. Smithson, Redwood City; William R. Hare, San Jose, both of Calif.

[73] Assignee: Silicon Graphics, Inc., Mountain View, Calif.

[21] Appl. No.: 592,890

[22] Filed: Jan. 29, 1996

[51] Int. Cl.$^6$ .................................. G06F 1/16; H05K 7/10
[52] U.S. Cl. .................................. 361/685; 361/727
[58] Field of Search ..................... 364/708.1; 439/928.1; 361/683–685, 725–727

[56] References Cited

U.S. PATENT DOCUMENTS

| | | | |
|---|---|---|---|
| 4,941,841 | 7/1990 | Darden et al. | 361/685 |
| 5,142,447 | 8/1992 | Cooke et al. | 361/685 |
| 5,235,493 | 8/1993 | Yu | 361/685 |
| 5,277,615 | 1/1994 | Hasting et al. | 361/685 |
| 5,369,492 | 11/1994 | Porter | 361/683 |
| 5,392,192 | 2/1995 | Dunn et al. | 361/683 |

*Primary Examiner*—Michael W. Phillips
*Attorney, Agent, or Firm*—Wagner, Murabito & Hao

[57] ABSTRACT

A drive sled assembly apparatus and method for readily installing and removing media drives. In one embodiment of the present invention, a drive sled is adapted to attach to a media drive. The sled consists of left and right rails that attach to the drive, and a lever that snaps on the front of the two rails. The attachment between the rails and the drive contain rubber grommets to dampen vibration and shock effects on the drive. The two rails and lever can be used to carry the drive using the lever as a handle. The rails are adapted to enable the drive and sled to slide into left and right guides attached to the computer chassis. In so doing, the drive can be installed or removed from the computer without opening the computer cover or having to unscrew the media drive from the computer chassis. In addition, one embodiment adapts the right rail to accommodate a light pipe. The light pipe is used to transfer LED signals from the back of the media drive to the front of the computer chassis without using loose wires. Also, an embodiment of the sled assembly has an adapter PCB assembly attached to the back, thus making the drive sled compatible with non-SCA drives.

3 Claims, 17 Drawing Sheets

SINGLE CONNECTOR ATTACHMENT DRIVE SLED ASSEMBLY HAVING LIGHT PIPE COUPLED TO A RAIL

TECHNICAL FIELD

The present invention pertains to computer media drives. Specifically, the present invention relates to an assembly providing simple installation, removal, and transporting of computer media drives.

BACKGROUND ART

Computer media drives are manufactured according to standard dimensions (e.g. 3½" or 5¼"). This allows computer chassis to be built to accommodate a variety of types of media drives manufactured by a variety of different companies. In addition, media drives are interchangeable within a chassis. For example, a computer chassis can accept a hard drive, a compact disco read only memory drive, a tape drive, and the like. Furthermore, a media drive can be moved from one chassis and fit into any other standard chassis. To remove or install a media drive, however, the cover of the computer chassis must be removed. Furthermore, tools must be used to detach the media drive from or attach the media drive to the computer chassis.

As shown in Prior Art FIG. 1, in the prior art, a media drive 102 is attached directly to the computer chassis 103 using one or more drive screws 104a–104d. The width 105 of media drives is standard, thereby allowing a variety of types of media drives (e.g. hard disk, CD ROM, digital audio tape, DAT, floptical, etc.) to be interchanged within the same drive bay 106.

However, interchanging media drives requires removing drive screws 104a–104d. The computer cover 107 must first be removed in order to gain access to drive screws 104a–104d. Once computer cover 107 is removed, access to drive screws 104a–104d is often obstructed. The obstruction exists because computer chassis are typically designed to occupy as little space as possible. Therefore, various items such as cables, power wires, other media drives, and peripheral equipment are tightly packed within the computer chassis. The tightly packed arrangement of items within typical computer chassis 103 makes the removal of drive screws 104a–104d an awkward and difficult process.

Additionally, several dangers result from removing drive screws improperly. For example, if a drive screw falls into the computer chassis during removal, in most chassis configurations, the drive screw it will drop onto the motherboard 108. Due to compact chassis design, it is very difficult to recover the drive screw from motherboard 108. Furthermore, if the drive screw is not located and recovered it can cause a short on motherboard 108 and seriously damage the computer.

Another danger associated with removing drive screws 104a–104d is that the entire media drive 102 may "drop" once the last screw is removed. In a typical computer chassis design, there is no protection beneath media drive 102. Thus, if the media drive 102 falls, it will damage whatever component resides beneath it. Such media drive drops often damage motherboard 108, another media drive, or the media drive being removed. Furthermore, in the prior art, once a media drive is removed from a computer chassis it is difficult to carry. Often the media drive is hot, has sharp edges, or is otherwise awkward to carry. Additionally, media drives frequently contain sensitive circuitry which can be damaged when touched due to electrical static discharge.

As an additional drawback, in the prior art, drive screws 104a–104d attach media drive 102 directly to computer chassis 103. Thus, media drive 102 is not protected from shock and vibration. Since media drive 102 consists of moving parts, it is susceptible to damage caused by internal vibrations and by shocks transferred from computer chassis 103. Also, loose drive screws 104a–104d exacerbate vibration and shock and increase media drive damage.

Prior art media drives typically have a light emitting diode LED connector for displaying the current status of the media drive. For example, an LED transmitting a green light indicates that the media drive is in use. However, connectors for the LED are commonly located on the back of the media drive. As a result, prior art computer chassis designs typically require wires (not shown) to transport LED signals from the back of media drive 102 to the front of computer chassis 103, such that the LED is visible to a user of the computer. As mentioned above, computer chassis are designed to conserve space. Thus, LED wires within the computer chassis often become entangled with other objects within the computer chassis. In addition, LED wires are susceptible to being cut or severed by some of the objects in the computer, thereby rendering the LED inoperative.

As a further complication, prior art media drives have two types of connector arrangements on the back surface thereof. Older prior art media drives have three separate connectors: a power connector; an address connector; and a signal connector. Multiple connectors are used by several types of media drives such as tape drives and older model disk drives. Newer prior art media drives contain a Single Connector Adapter, SCA, which integrates power address and signal connectors all into a single connector. Both SCA and non-SCA media drives are still in common use.

Thus, a need exists for an apparatus and method which allows media drives to be interchangeably used in different computer chassis without requiring the removal of drive screws. A further need exists for an apparatus and method to transfer LED signals from the back of a media drive to the front of a computer chassis without requiring the use of loose wires. A further need exists for an apparatus which eliminates the awkwardness associated with handling media drives.

DISCLOSURE OF THE INVENTION

It is therefore an object of the present invention to provide an apparatus and method which allows a media drive to be installed or removed from a computer chassis without requiring the removal of the computer chassis cover and without requiring the use of tools to unscrew the media drive from the chassis. It is a further object of the present invention to provide a light pipe for transferring LED signals from the back of the media drive without the need for loose wires, and an apparatus which is compatible with both SCA and non-SCA media drives. It is yet another object of the invention to provide an apparatus which eliminates awkwardness associated with handling media drives. The above objects have been achieved by a readily removable drive sled assembly having drive guides, rails, a lever, a light pipe, and a printed circuit board, PCB SCA adapter for removable media drives.

A readily attachable and detachable computer media drive assembly is disclosed. In one embodiment of the present invention, left and right drive guides are adapted to snap into holes in the computer chassis. Rails attached to a media drive are adapted to slide along the drive guides. A lever is adapted to snap onto the rails. The lever is used as a handle to slide the media drive and rafts into and out of the computer chassis along the drive guides. The lever is used as a carrying handle for the media drive once the media drive is removed from the chassis. The lever is also used as a locking device to firmly hold the computer media drive assembly within the computer chassis, and to prevent the computer media drive assembly from vibrating loose from the computer chassis.

In one embodiment of the present invention, the rails are tapered from back to front such that the rails initially slide easily along the drive guides. The drive guides also taper, such that the media drive is tightly held between the drive guides when the media drive is completely inserted into the computer chassis. By tightly holding the media drive between the drive guides, the present invention reduces the mount of vibration and shock transferred to the media drive.

In another embodiment, the present invention includes the above described features and further includes rubber grommets which protect the media drive from shock and vibration.

In another embodiment, a light pipe snaps onto one of the rails. The light pipe is used to transfer LED signals from the back of the media drive to the front of the chassis without using loose wires.

A method for readily installing and removing a media drive from a computer chassis in accordance with the above described apparatus is also disclosed.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 2:
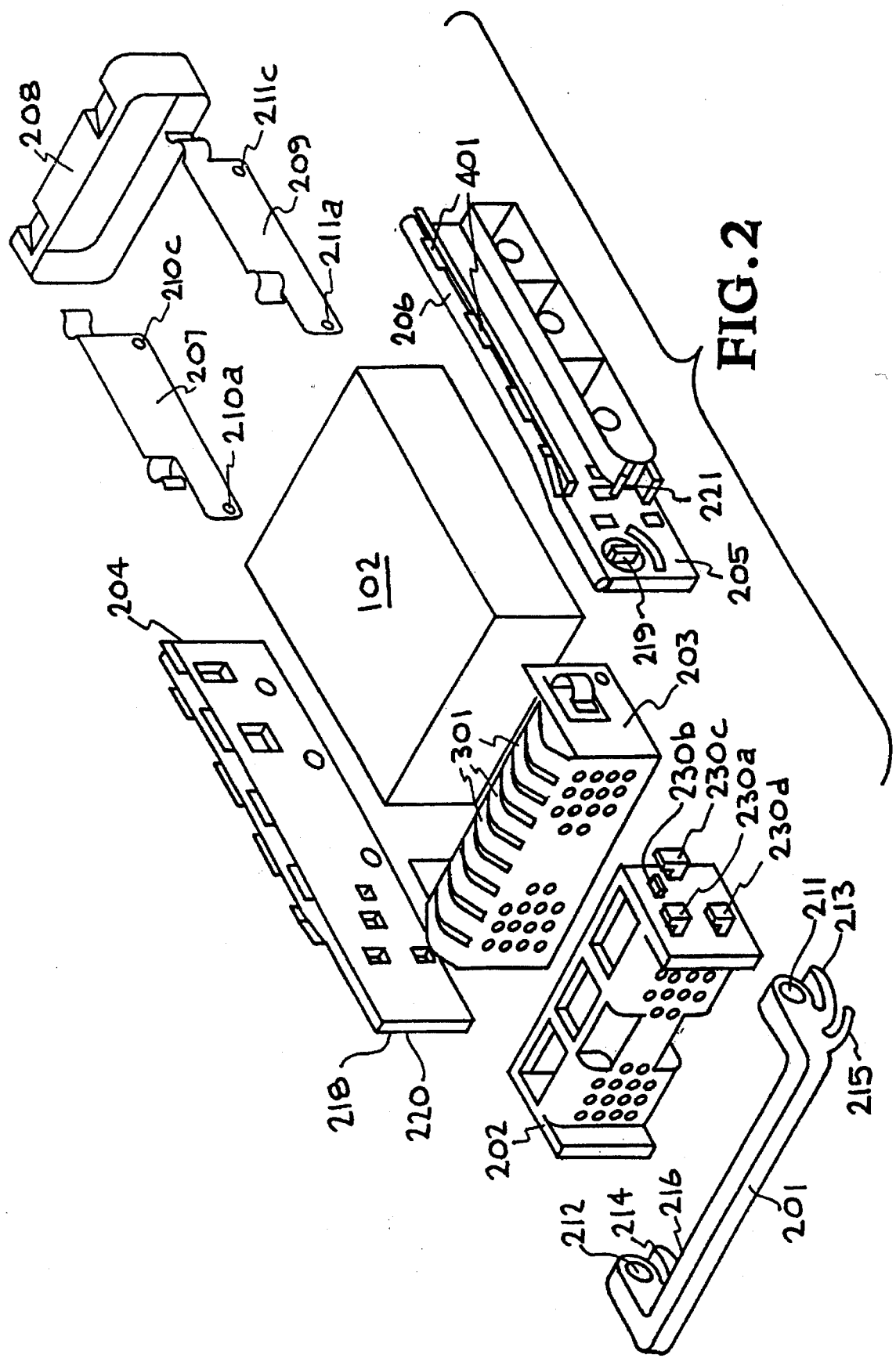
FIG. 2 is an exploded view of a readily removable drive sled assembly in accordance with the present claimed invention.

With reference now to FIG. 2, an exploded perspective view of a readily removable drive sled assembly in accordance with the present claimed invention is shown. The following description of the present invention will begin with a detailed description of the physical characteristics of the present invention. This description will then be followed by a detailed description setting forth the assembly and operation of the present invention. Regarding the physical characteristics of the present embodiment, the readily removable drive sled assembly includes a lever 201. Lever 201 includes left and right lever holes 211 and 212 respectively. Lever 201 further includes four lever fingers, left upper lever finger 213, right upper lever finger 214, left lower lever finger 215, and right lower lever finger 216.

Referring still to FIG. 2, the present embodiment also includes a front bezel 202. Front bezel 202 has bezel tabs, typically shown as 230a–230c extending from the right side thereof. Similar bezel tabs also extend from the left side of front bezel 202 but are hidden from view in FIG. 2. Front bezel 202 is designed to accommodate an EMI shield 203 therein. EMI shield 203 includes shield tabs 301.

Referring again to FIG. 2, the present invention also includes left and right rails 204 and 205 respectively. In the present embodiment, each of rails 204 and 205 has four rail holes. A more detailed view of right rail 205 and the four holes therein is shown in FIG. 3.

Figure 3:
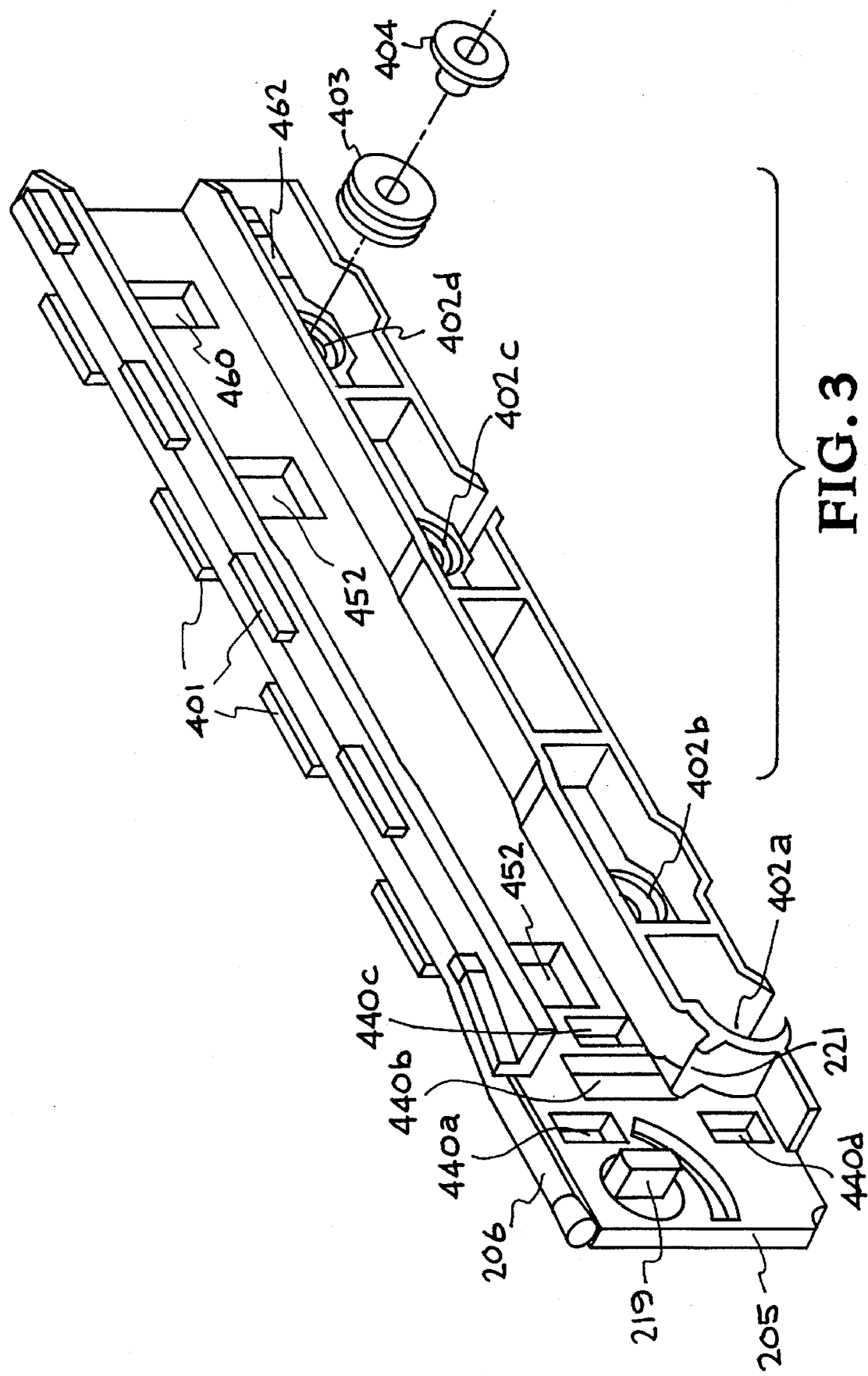
FIG. 3 is an exploded view of a right rail in accordance with the present claimed invention.

FIG. 3 shows rail holes 402a–402d of right rail 205. Rail holes 402a–402d are used to accommodate screws, not shown, which attach right rail 205 to the right side of media drive 102. Although there are four rail holes shown on right rail 205, only two holes per rail are required for most media drives at one time. However, since existing media drives do not always have their holes in the same location, the extra rail holes are used to accommodate various media drives and different types of media drives. For example, rail holes 402a, 402c are positioned to accommodate removable media drives, while rail holes 402b and 402d accommodate an SCA hard disk drive. FIG. 3 also shows rail slots 440a–440d. Likewise, left rail 204 also includes rail slots. Additionally, right rail 205 has gaps 450 and 452, formed therein. Likewise, left rail 204 has gaps formed at the same location therein. Furthermore, FIG. 3 also shows that right rail 205 has slots 460 and 462, formed therein. Likewise, left rail 204 has slots formed at the same location therein.

Still referring to FIG. 3, each of rail holes 402a–402d are also designed to accommodate a rubber grommet 403 and spacer 404. Rubber grommet 403 and spacer 404 are designed to accommodate a screw (not shown) which is used to attach the left and right rails 204 and 205 of FIG. 2 to media drive 102. Rubber grommet 403 dampens vibration and shock effects on the media drive. Although FIG. 3 shows a rubber grommet 403 and spacer 404 inserted into each of rail holes 402a–402d, the present invention is also well suited to an embodiment which does not include any rubber grommets or spacers.

Referring again to FIG. 2 left rail 204 has a left mushroom boss 218 protruding therefrom. Likewise, right rail 205 has a right mushroom boss 219 protruding therefrom. Mushroom bosses 218 and 219 are designed to fit through left and right lever holes 211 and 212, respectively, of lever 201. A more detailed view of right mushroom boss 219 protruding from right rail 205 is shown in FIG. 3.

Referring again to FIG. 2, left rail 204 has a left rail tab 220 protruding therefrom. Likewise, right rail 205 has a right rail tab 221 protruding therefrom. Left and right rail tabs 220 and 221 are adapted to snap into and left and right lower lever fingers 215 and 216, respectively of lever 201. Furthermore, left and right rail tabs 220 and 221 are adapted be removably locked into place between left and right lower lever fingers 215 and 216, respectively, of lever 201. A more detailed view of right rail tab 221 on right rail 205 is shown in FIG. 3. Left and right rails 204 and 205 taper from back to front. That is, the height of right rail 205 is greater in the front than it is in the back. Likewise, the height of left rail 204 tapers in a similar fashion from front to back. However, the present invention is also well suited to left and right rails that do not taper.

With reference still to FIG. 2, the present embodiment further includes a light pipe 206. As shown in FIG. 3, light pipe 206 snaps between upper rail tabs, typically shown as 401, of right rail 205. The present invention is also well suited to attaching light pipe 206 to the bottom of right rail 205 or to left rail 204. In addition, the present invention is well suited to an embodiment which does not include a light pipe. Light pipe 206 carries LED signals from the back to the front of 102 media drive such that the light signals are visible to a user of media drive 102. Thus, the present embodiment eliminates the need to have loose wires carry the LED signals to the front of media drive 102.

Figure 1:
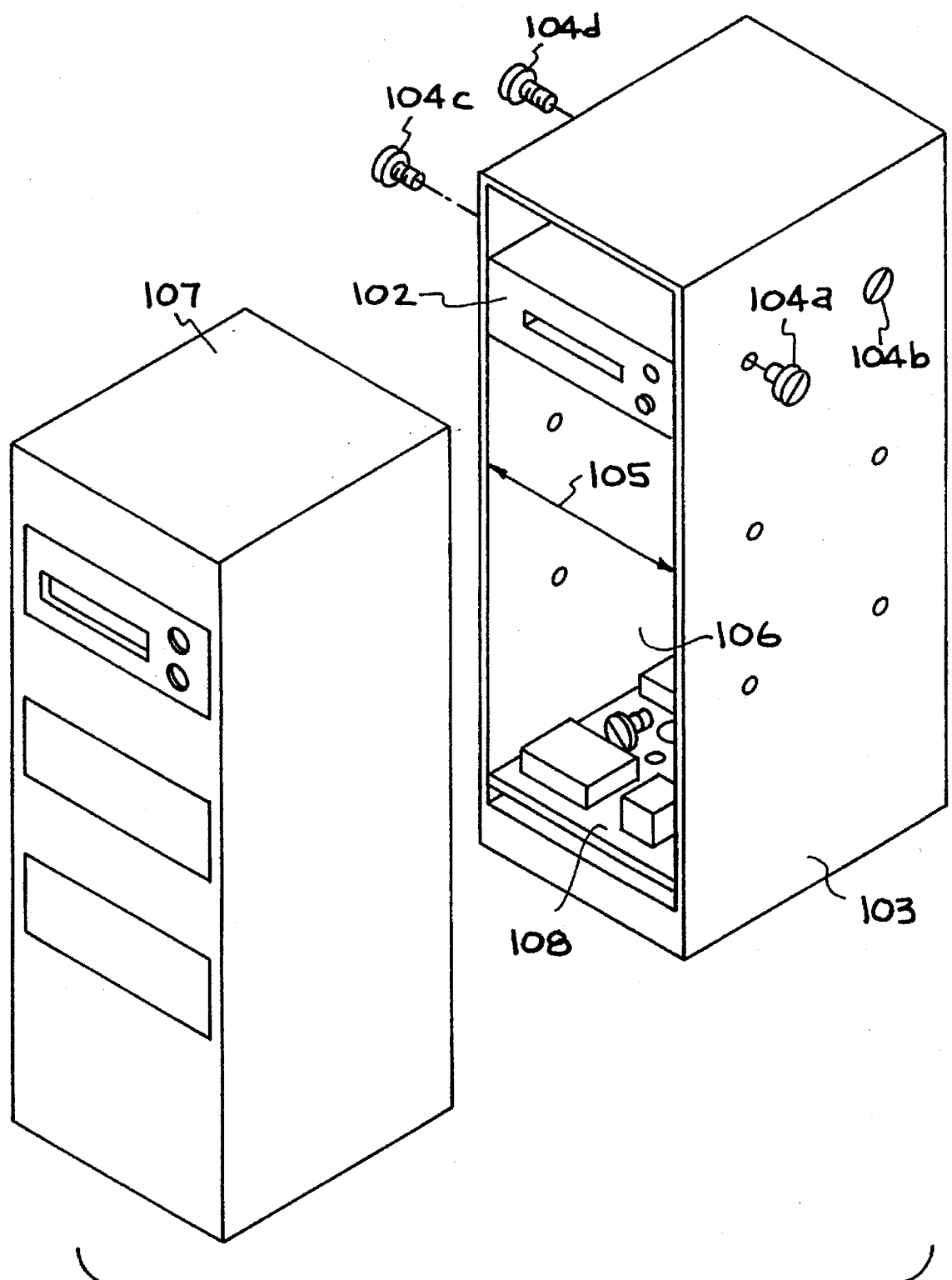
FIG. 1 is a front perspective view of a prior art media drive inserted into a computer chassis.

With reference again to FIG. 2, the present embodiment also includes an adapter PCB assembly 208 designed to accommodate a SCA adapter (not shown). Adapter PCB assembly 208 has left and right ESD gaskets 222 and 207, each with four ESD gasket holes 209a–209d and 210a–210d. The ESD gasket holes 209a–209d and 210a–210d are designed to accommodate screws 104a–104d of FIG. 1.

Figure 4:
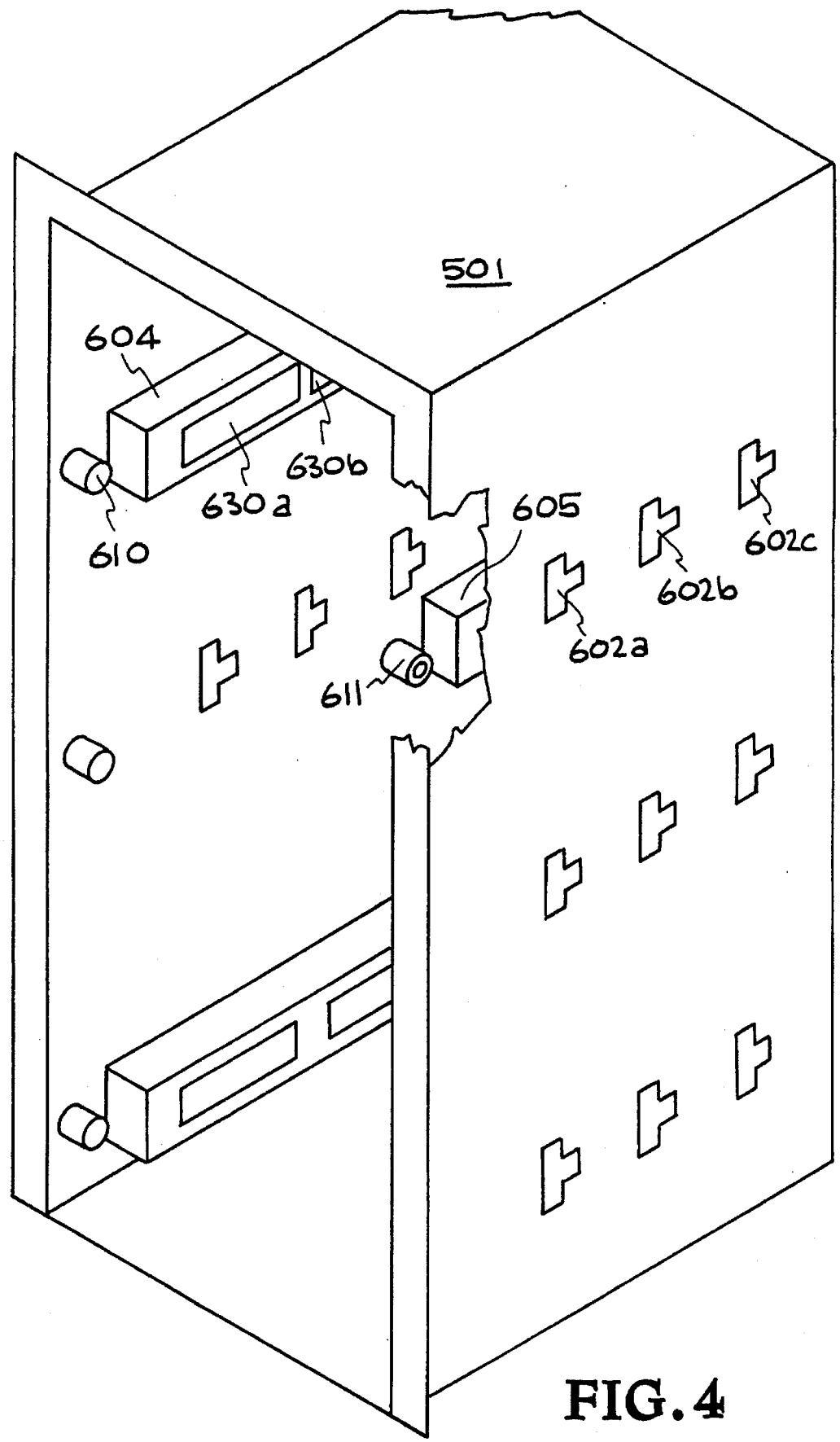
FIG. 4 is an exploded view of a drive guide and computer chassis assembly in accordance with the present claimed invention.
Figure 5A:
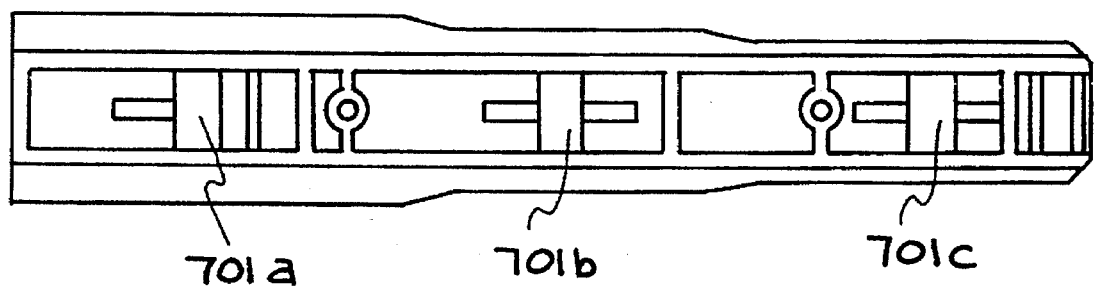
FIG. 5A is side view of a right drive guide in accordance with the present claimed invention.

Referring now to FIG. 4 an exploded view of computer chassis 501 and left and right drive guides 604 and 605 is shown. Left and right drive guides 604 and 605 taper from back to front. That is, the height of left and right drive guides 604 and 605 is greater in the back than in the front. However, the present invention is also well suited to left and right drive guides that do not taper. Each of left and right drive guides 604 and 605 has three guide tabs. FIG. 5A shows clearly guide tabs 701a–701c on right drive guide 605. The present invention is also well suited for a fewer or greater number of guide tabs.

Referring again to FIG. 4, computer chassis 501 has three chassis holes on the left side 601a–601c, hidden, and three chassis holes on the right side 602a–602c. Left chassis holes 601a–601c, hidden, accommodate left guide tabs on left drive guide 604, while right chassis holes 602a–602c accommodate right guide tabs 701a–701c of FIG. 5A. The guide tabs of left and right drive guides snap-fit into respective chassis holes of computer chassis 501. For example, right drive guide tabs 701a–701c snap-fit into right chassis holes 602a–602c. The present invention is also well suited to a fewer or greater number guide tabs. The present invention is also well suited to using other methods to attach left and right drive guides 604 and 605 to computer chassis 501.

With reference still to FIG. 4, computer chassis 501 further includes left and right chassis tabs 610 and 611 disposed in front of left and right chassis holes 601a and 602a.

Figure 5B:
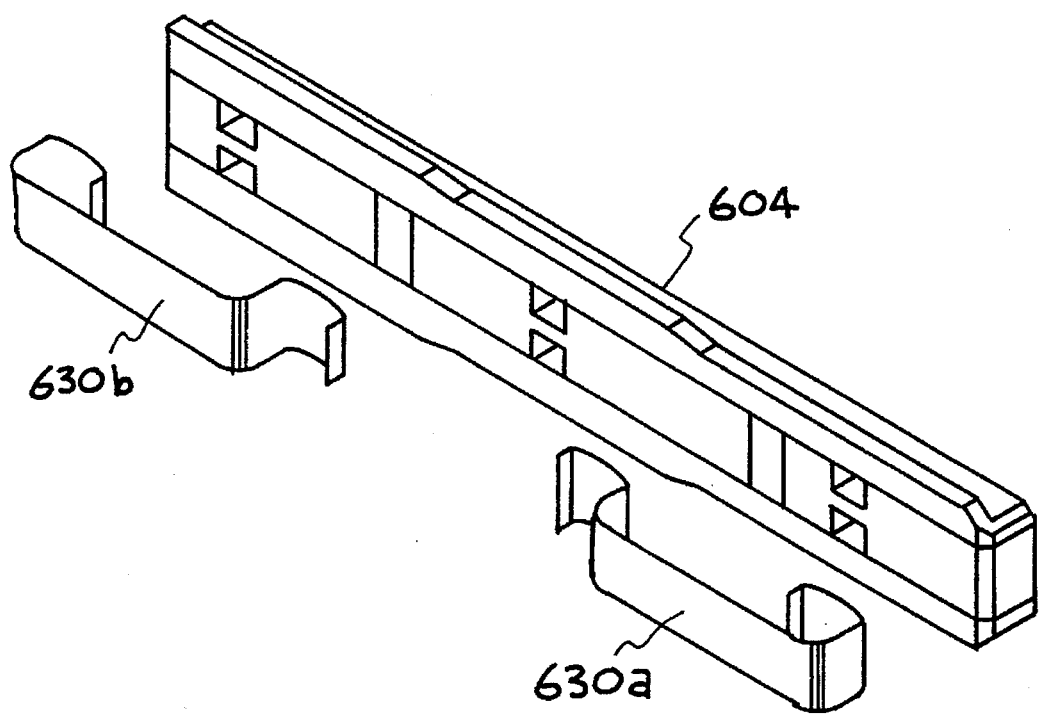
FIG. 5B is an exploded view of a right drive guide in accordance with the present claimed invention.

Left drive guide 604 is adapted to have two ESD plates shown as 630a and 630b coupled thereto. Likewise, right drive guide 605 is adapted to have two ESD plates shown as 632a and 632b, not shown, coupled thereto. FIG. 5B more clearly shows ESD plates 630a and 630b positioned to be snap-fit into left drive guide 604.

IN OPERATION

Figure 6A:
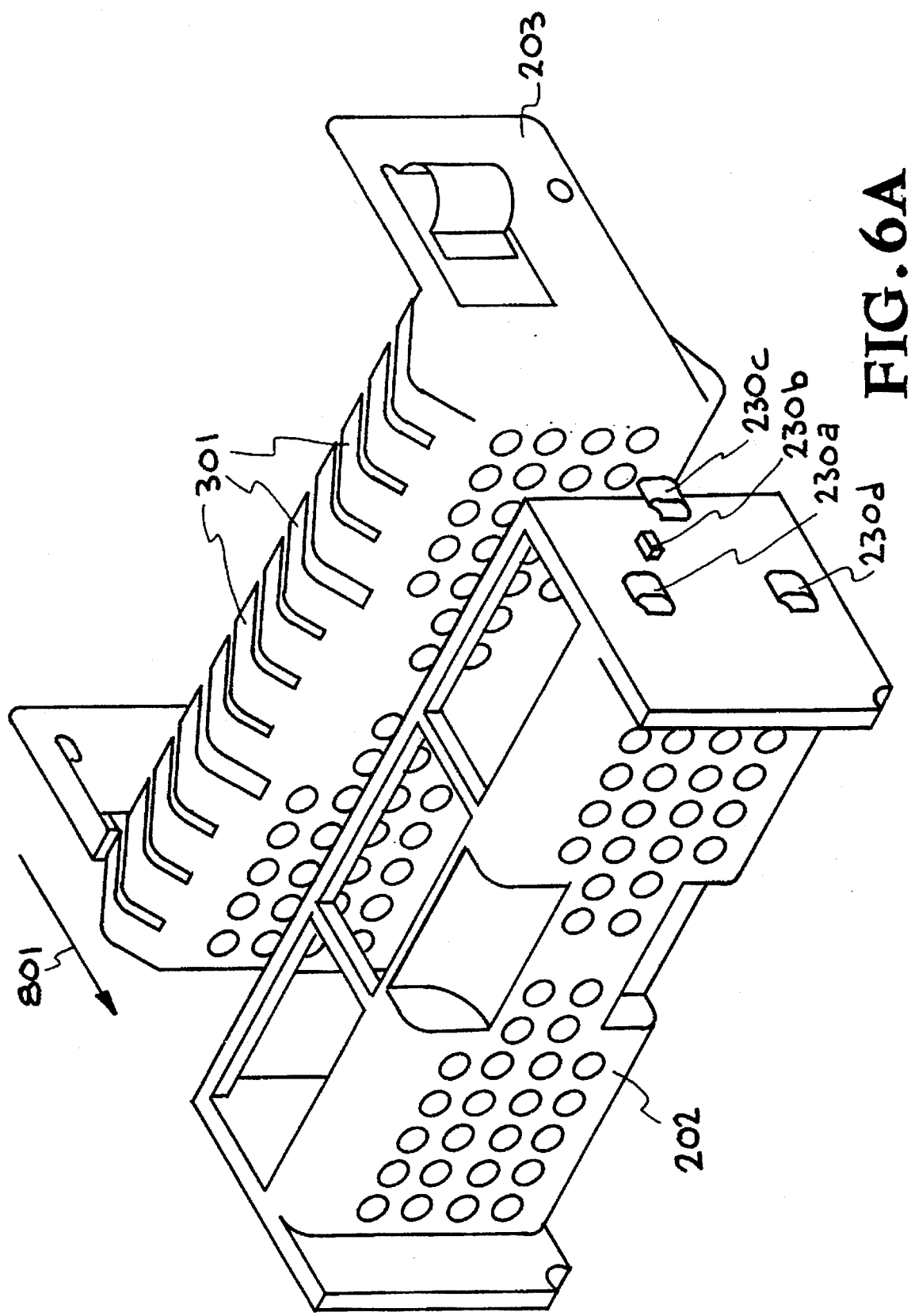
FIG. 6A is a perspective view of an electro-magnetic interference, EMI, gasket and a front bezel in accordance with the present claimed invention.
Figure 6B:
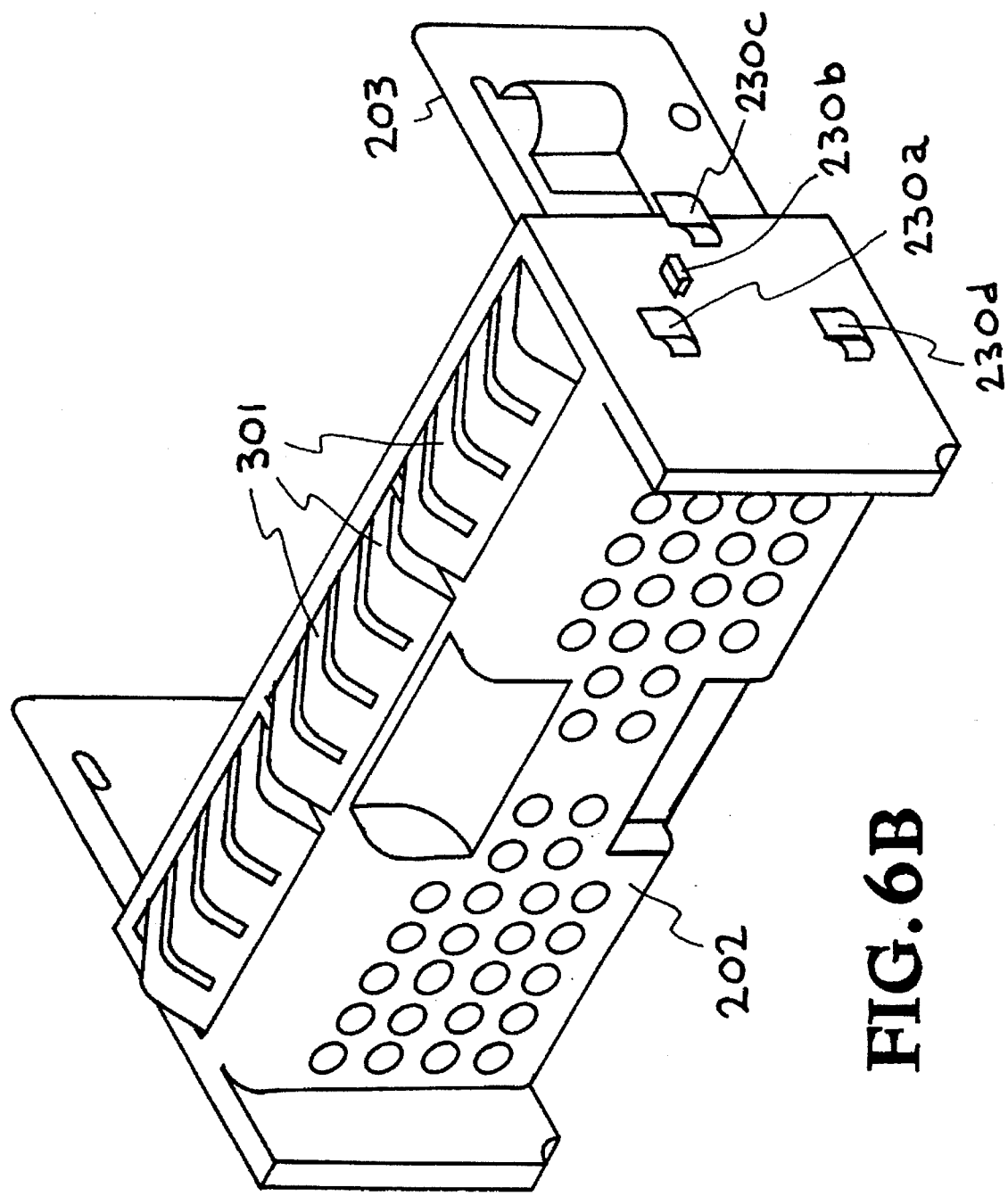
FIG. 6B is a perspective view of an EMI gasket inserted into a front bezel in accordance with the present claimed invention.
Figure 7:
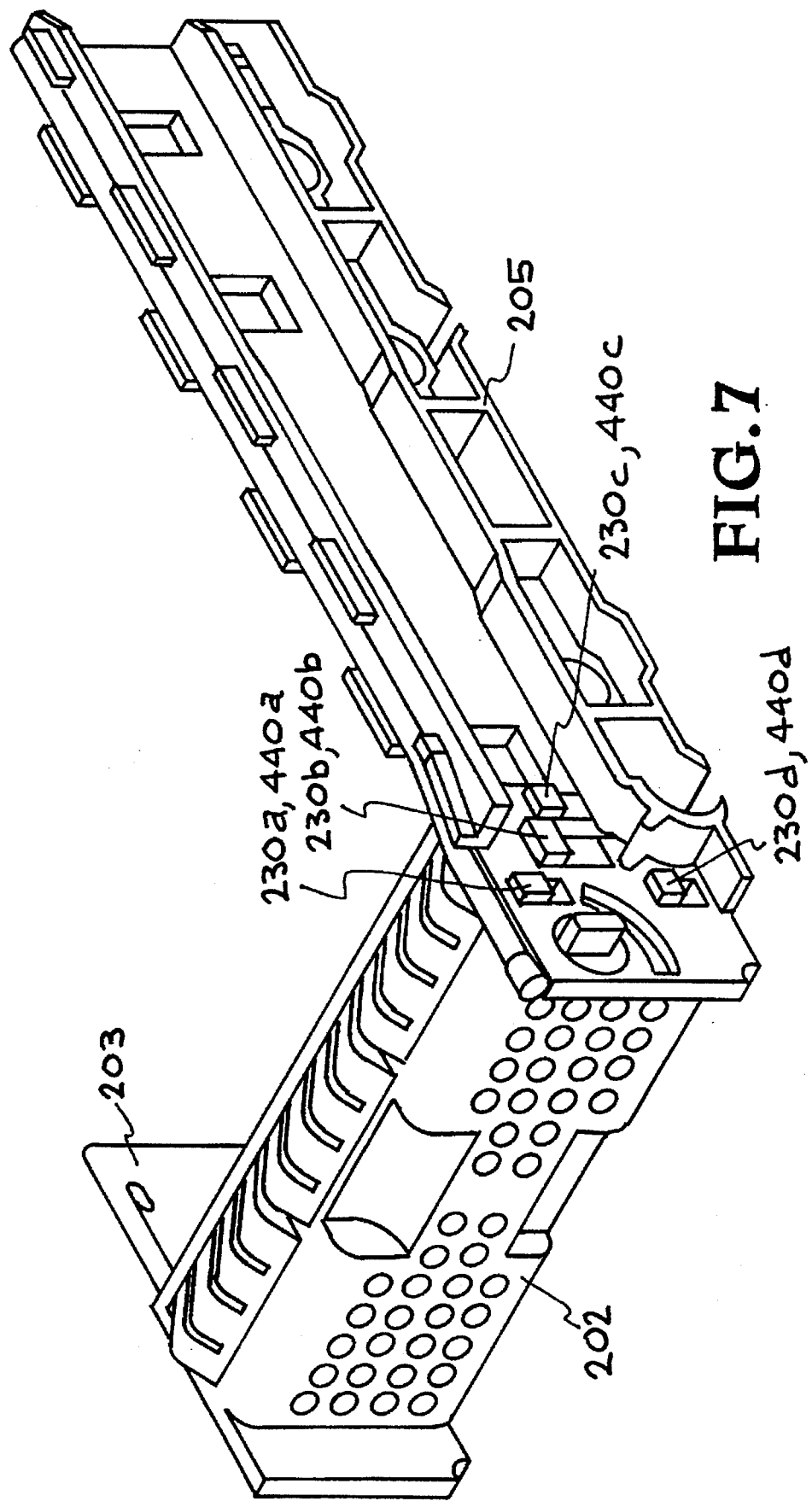
FIG. 7 is a perspective view of a right rail snap fit onto the right side of the assembly of FIG. 6B in accordance with the present invention.

The following is a detailed description of the operation of the present invention. With reference now to FIG. 6A, an initial step used in the assembly of the present invention is illustrated. EMI shield 203 is pressed into front bezel 202 by pushing EMI shield 203 in the direction indicated by arrows 801. EMI shield 203 snaps into front bezel 202 using EMI shield tabs 301. FIG. 8B shows EMI shield 203 locked in front bezel 202 by pressing EMI shield 203 onto bosses or protrusions on front bezel 202. Locking finger With reference next to FIG. 7, right rail 205 is attached to the right side of front bezel 202 using by inserting bezel tabs 230a–230d through rail slots 440a–440d, respectively, of right rail 205. Bezel tabs 230a–230d snap fit through rail slots 440a–440d, such that right rail 205 is attached to front bezel 202 without requiring screws or other attachment devices. A locking finger disposed within slot 440b of right rail 205 snaps behind tab 230b of front bezel 202 thereby locking the present bezel 202 and rail 205 assembly together.

Figure 8:
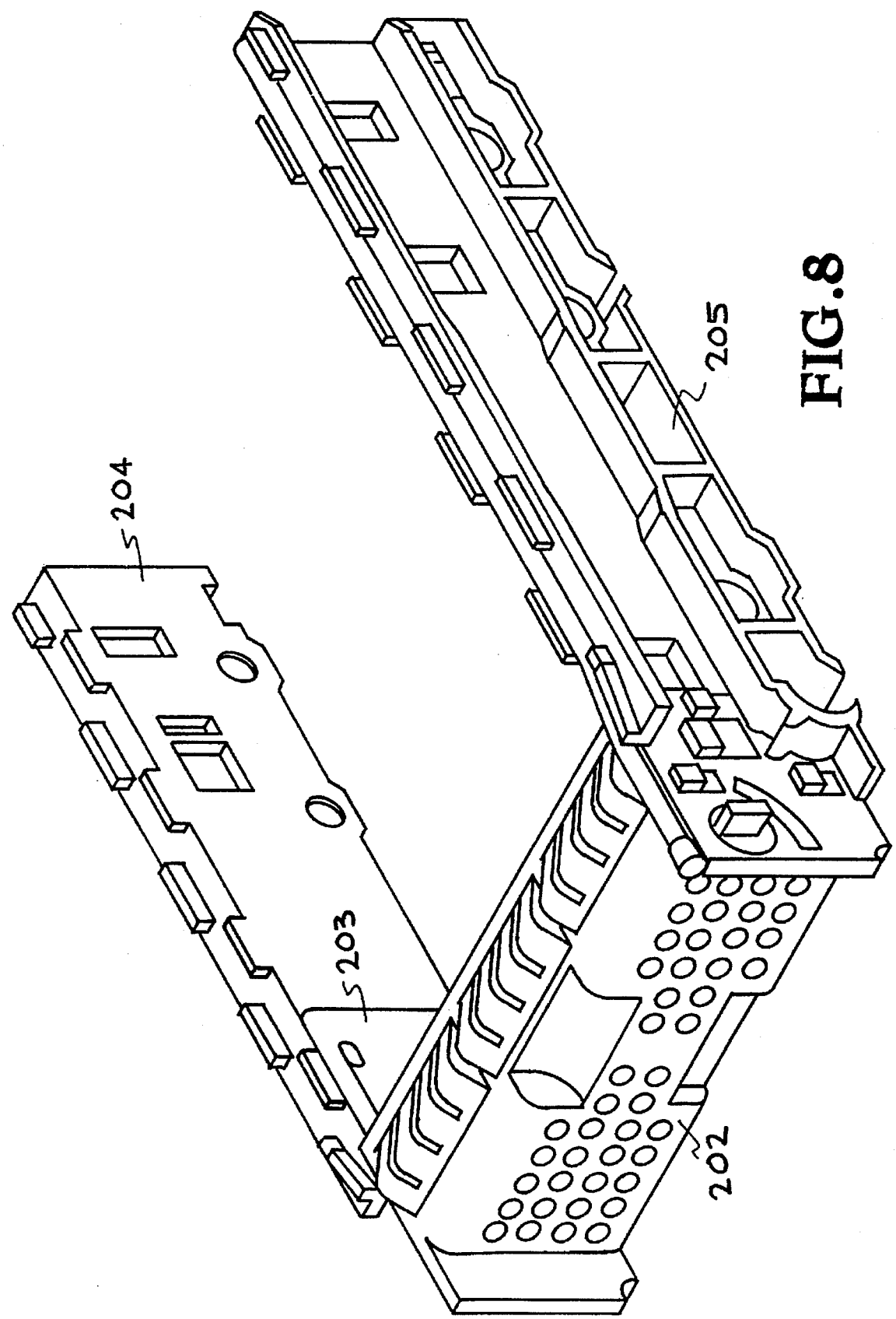
FIG. 8 is a perspective view of a left raft snap fit onto the left side of the assembly of FIG. 7 in accordance with the present invention.

With reference now to FIG. 8, left rail 204 is attached to the left side of front bezel 202 using by inserting bezel tabs, not shown, on front bezel 202 through left slots, not shown, of left rail 204. As mentioned above, the bezel tabs snap fit through the rail slots, such that left rail 204 is attached to front bezel 202 without requiring screws or other attachment devices.

Figure 9:
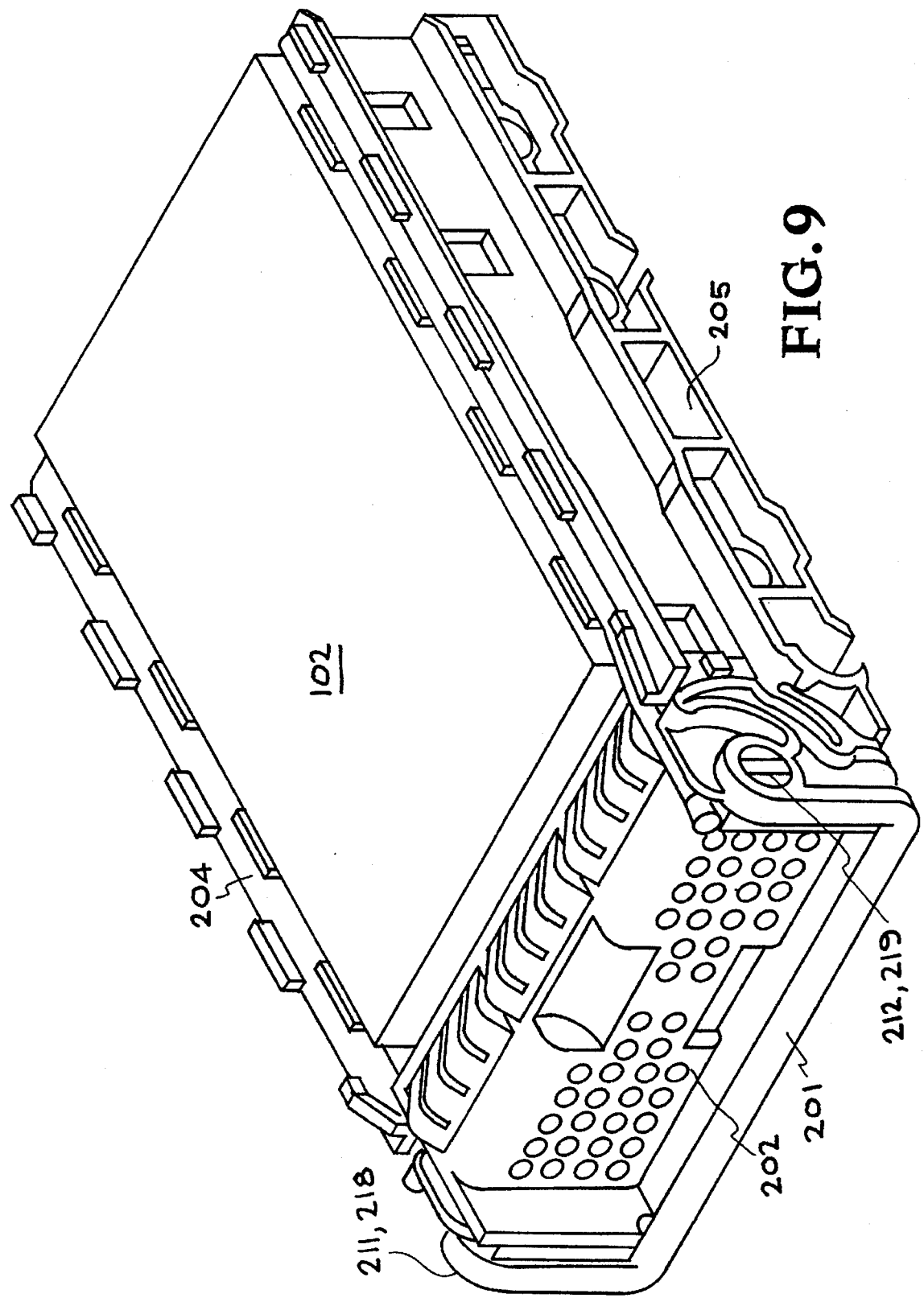
FIG. 9 is a perspective view of a lever snap fit onto the front of the assembly of FIG. 8 in accordance with the present invention.

Referring now to FIG. 9, lever 201 is attached to the front portion of left and right rails 204 and 205. Lever 201 is attached by snapping left lever hole 211 over left mushroom boss 218 of left rail 204. In the present embodiment, lever 201 is slightly pliable. As a result, even after the left portion of lever 210 is attached to left rail 204, lever 201 can be bent such that right lever hole 212 can be fit over right mushroom boss 219 of right rail 205. Once again, lever 201 snap fit to left and right rails 204 and 205 thereby eliminating the need for screws or other attachment devices. Both mushroom boss 218 and mushroom boss 219 are shaped such that left and right lever holes 211 and 212, respectively, easily fit thereover when lever 201 is oriented in a particular direction. However, once lever 201 is snap fit over mushroom bosses 218 and 219 lever 201 will swivel on mushroom bosses 218 and 219 but will not easily detach therefrom.

Figure 10:
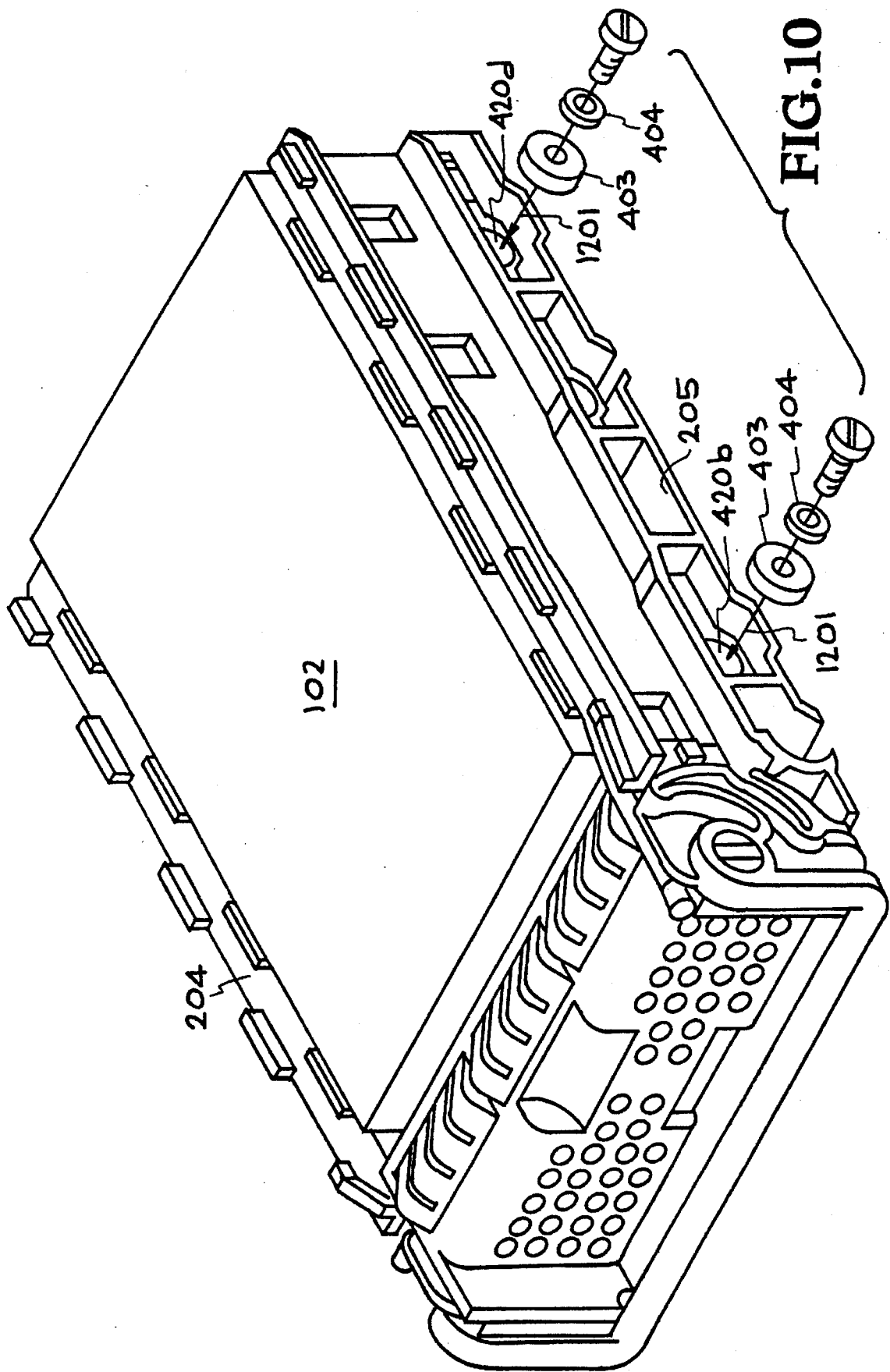
FIG. 10 is a perspective view of screws aligned for insertion through the sides of the assembly of FIG. 9 and into a media drive in accordance with the present invention.

With reference now to FIG. 10, screws are used to attach left and right rails 204 and 205 to media drive 102. As illustrated by FIG. 9, the screws extend through right rail holes 402b and 402d, for example, as indicated by arrows 1201 to attach right rail 205 to the right side of media drive 102. Likewise, screws extend through left rail holes to attach left rail 204 to the left side of media drive 102. The screws used to attach rails 204 and 205 to media drive 102, are the only screws required in the present invention.

With reference still to FIG. 10, a rubber grommet 403 and a spacer 404 are inserted along with the screw into rail holes 402b and 402d, for example. Grommet 403 and spacers 404 dampen external shock and vibration thereby protecting media drive 102 from damage. Although the present embodiment contains a front bezel 202 and EMI shield 203, the present invention is also well suited to not having such features. For example, although front bezel 202 and EMI shield 203 are advantageous when media drive 102 is a hard drive, such features are not required when media drive 102 is a tape drive, DAT drive, or floptical. In such embodiments, left and right rails 204 and 205 are attached to the media drive without having front bezel 202 and EMI shield 203 disposed between left and right rails 204 and 205.

Figure 11:
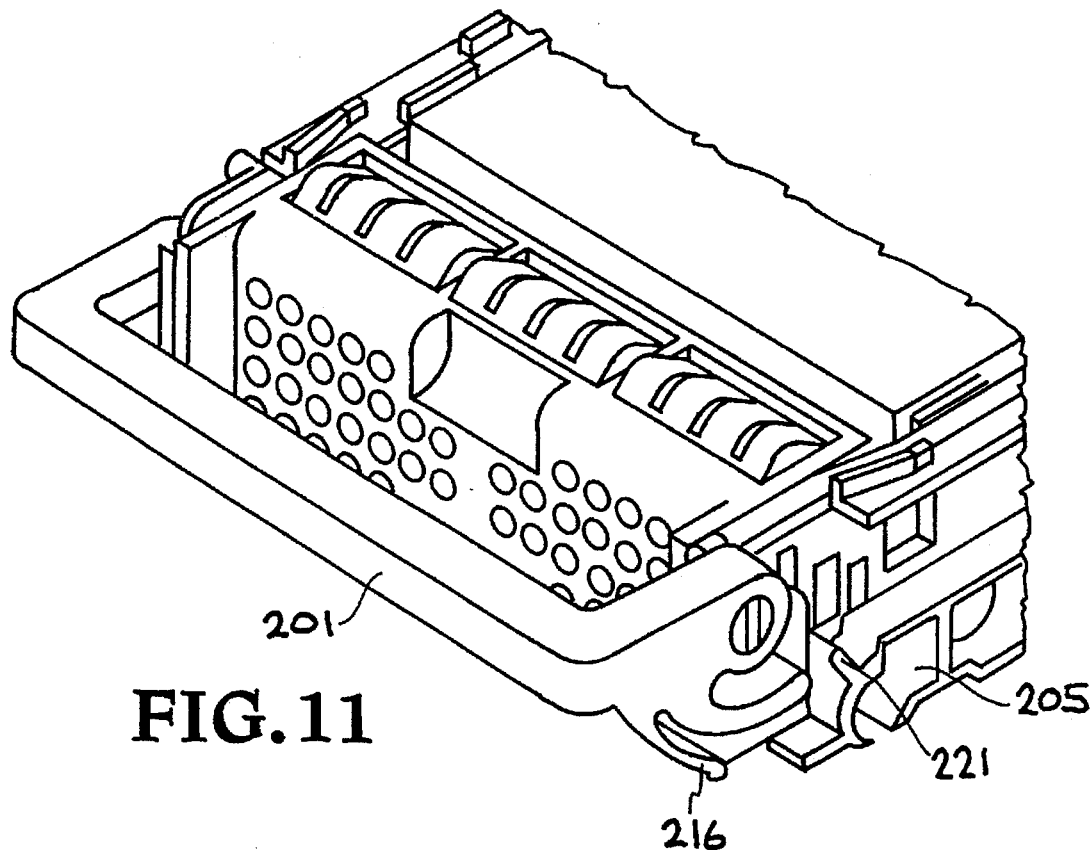
FIG. 11 is a perspective view of a lever in an upward unlocked position in accordance with the present invention.

Referring now to FIG. 11, lever 201 is shown in an upward and unlocked position. When lever 201 is in such a position, right lower lever finger 216 is not in contact with right rail tab 221 of right rail 205. Likewise, lever 201 is in such a position, left lower lever finger, hidden, is not in contact with left rail tab, hidden, of left rail 204. Lever 201 swivels freely about mushroom bosses 218 and 219 when lever 201 is in such an upward orientation.

Figure 12:
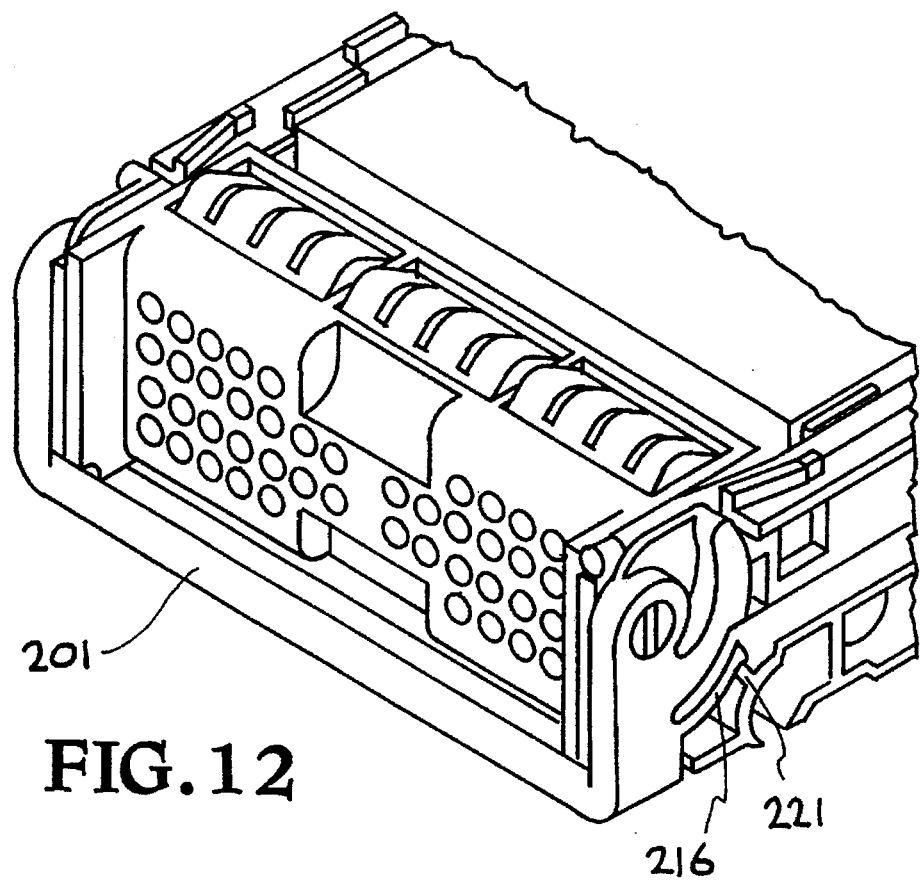
FIG. 12 is a perspective view of a lever in a downward and locked position in accordance with the present invention.

With reference next to FIG. 12, when lever 201 is pushed downward, right lower lever finger 216 snaps over right rail tab 221 thereby locking lever 201 in place. Likewise, when lever 201 is pushed downward, left lower lever finger, hidden, snaps over left rail tab, hidden.

Figure 13A:
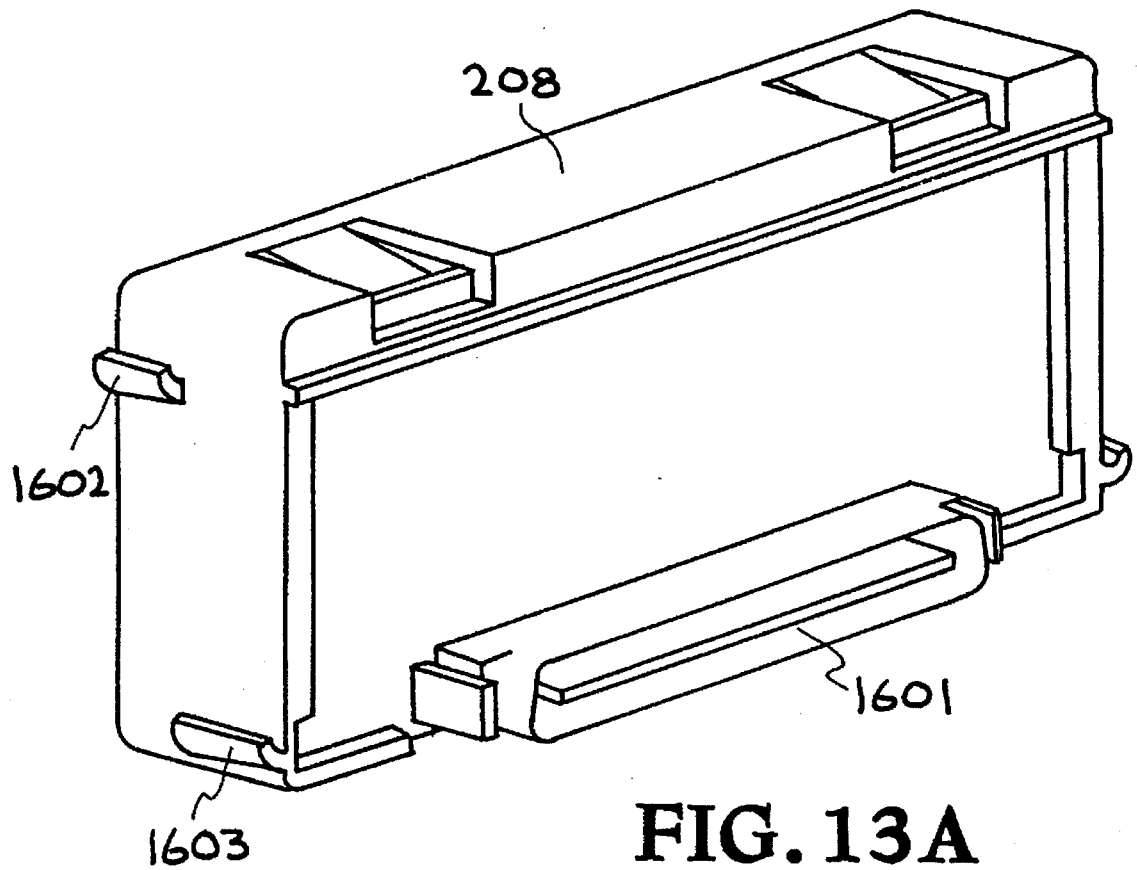
FIG. 13A is a perspective view of the back surface of an adapter PCB assembly for non SCA devices.

With reference now to FIG. 13A, the back surface of an adapter PCB assembly 208 is shown. Adapter PCB assembly 208 integrates the three connectors found in some media drives to one single connector 1601. In so doing, adapter PCB assembly 208 allows a non-SCA media drive to electrically couple with an SCA equipped computer chassis. Although such a component is described herein, it will be understood that such a component will only be necessary when a non-SCA media drive is used in conjunction with the present drive sled assembly in an SCA equipped computer chassis. Adapter PCB assembly 208 further includes tabs 1602 and 1603 extending from the right side thereof. Similar tabs extend from the left side of adapter PCB assembly 208, but are hidden in FIG. 13A.

Figure 13B:
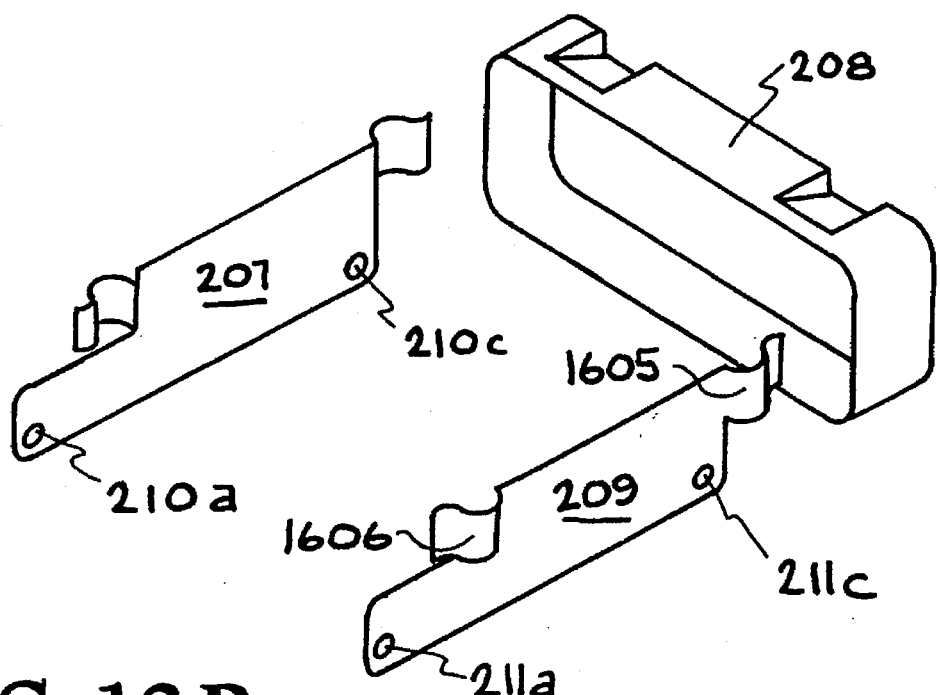
FIG. 13B is a perspective view of an adapter PCB assembly disposed adjacent to electro-static discharge, ESD, gaskets.

Referring now to FIG. 13B, adapter PCB assembly 208 is shown disposed next to left and right ESD gaskets 207 and 209, respectively. ESD gaskets 207 and 209 insure that the present drive sled assembly complies with electric field and grounding requirements. Right ESD gasket 209 has holes 211a and 211b formed therethrough. Holes 211a and 211b are positioned to be aligned with holes 402a and 402c in right rail 205. Likewise, left ESD gasket 207 has holes 210a and 210b formed therethrough which are positioned to be aligned with holes in left rail 204. Thus, screws 104a and 104c extending through holes 402a and 402c in right rail 205 and into media drive 102 will also extend through holes 211a and 211b of ESD gasket 209. Right ESD gasket 209 has flanges 1605 and 1606 which positioned to be inserted into gaps 450 and 452, respectively of right rail 205. Holes 211a and 211b are positioned to be aligned with holes 402a and 402c in right rail 205. Likewise, left ESD gasket 207 has holes 210a and 210b formed therethrough which are positioned to be aligned with holes in left rail 204.

Figure 13C:
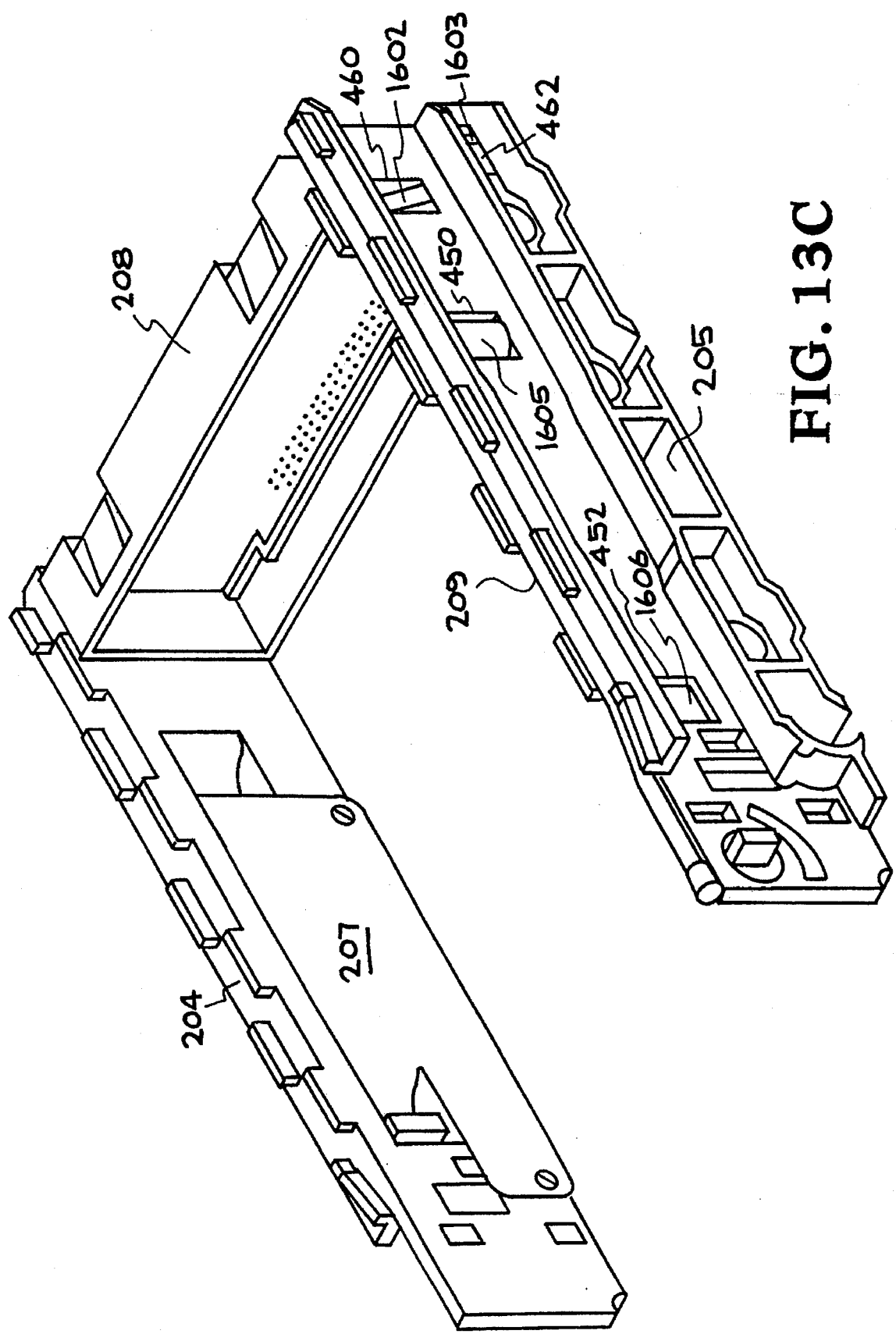
FIG. 13C is a perspective view of an adapter PCB assembly and ESD gaskets disposed between rails in accordance with the present invention.

With reference next to FIG. 13C, adapter PCB assembly 208 and ESD gaskets 207 and 209 are shown disposed between left and right rails 204 and 205. As shown in FIG. 16C, in the present embodiment, flanges 1605 and 1606 of right ESD gasket 209 are inserted into gaps 450 and 452, respectively of right rail 205. Likewise, tabs 1602 and 1603 of adapter PCB assembly 208 are inserted into slots 460 and 462, respectively, of right rail 205. In so doing adapter PCB assembly 208 and ESD gasket 209 are coupled to right rail 205. Left rail 204 is attached to adapter PCB assembly 208 and ESD gasket 209 in a similar manner. Hence, the present drive sled assembly accommodates both SCA and non-SCA configured media drives.

Figure 14:
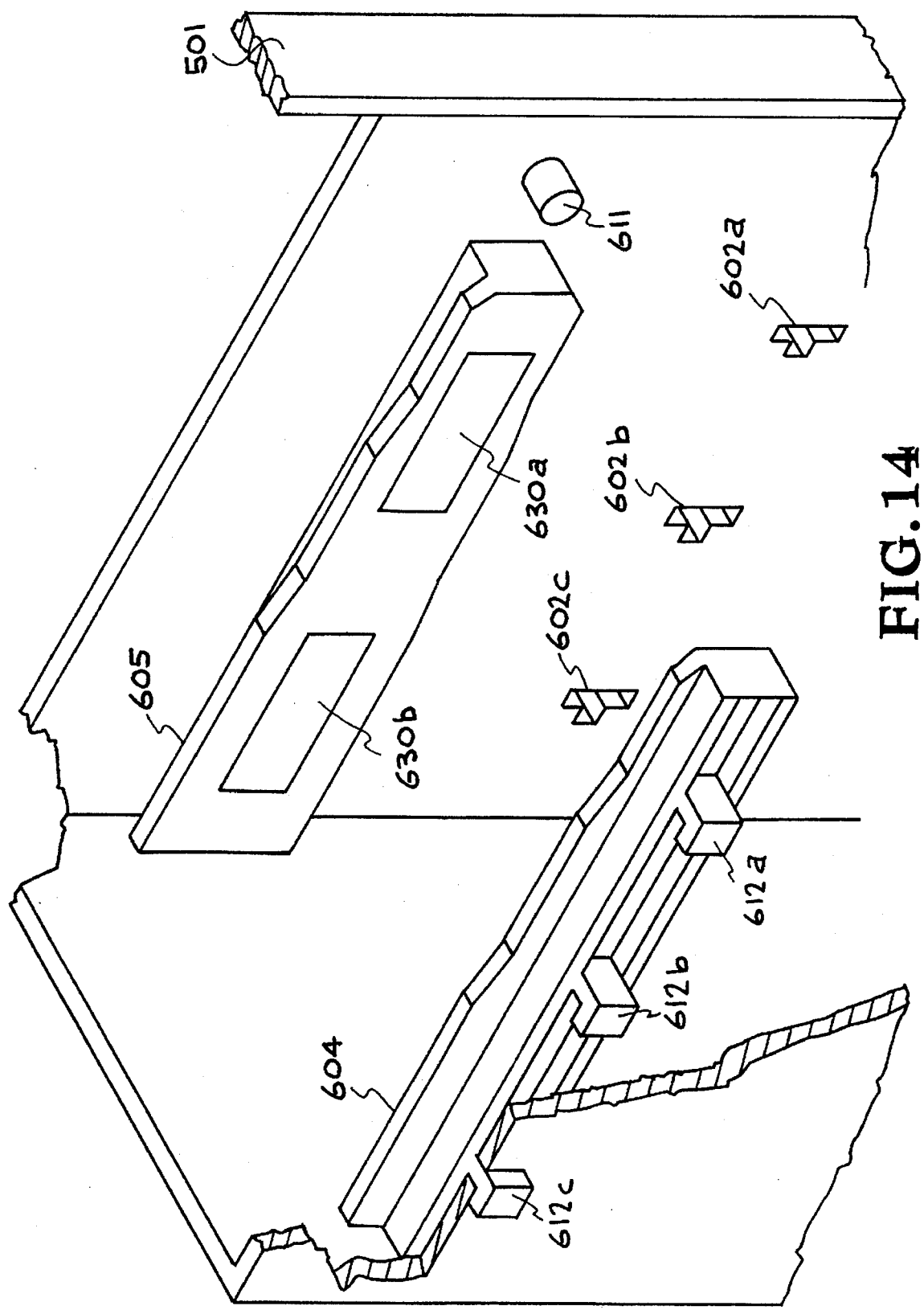
FIG. 14 is a perspective view of left and right drive guides attached to a computer chassis in accordance with the present invention.

Referring now to FIG. 14, left and right drive guides 604 and 605 each have three guide tabs. Left and right drive guides 604 and 605 attach to computer chassis 501 by snapping left guide tabs 612a–612c into left chassis holes 601a–601c, hidden. Right guide tabs 605a–605c of right drive guide 605 are likewise snapped into right chassis holes 602a–602c.

Figure 15A:
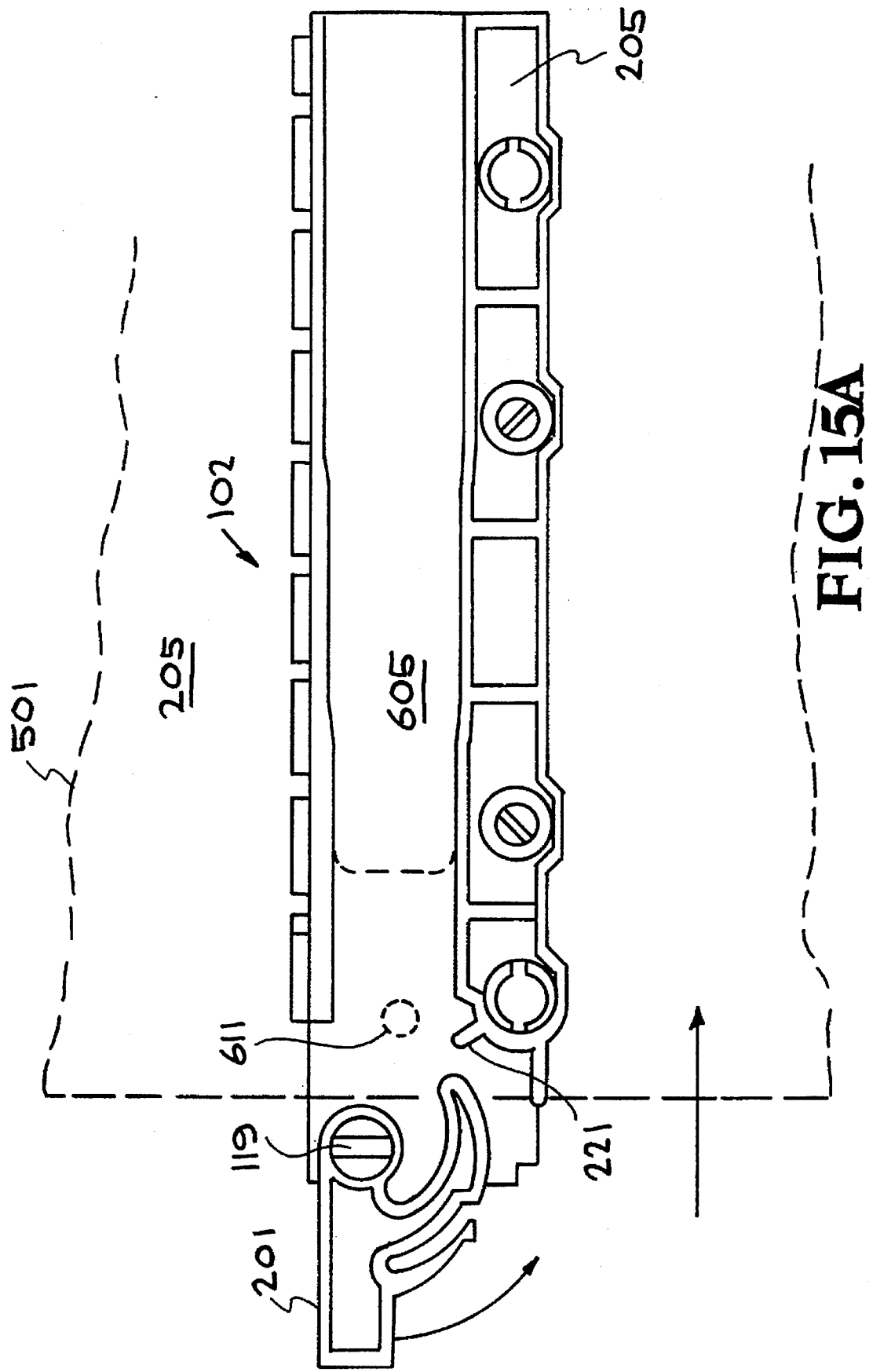
FIG. 15A is a side view of a media drive attached to the present drive sled assembly being inserted into a computer chassis in accordance with the present invention.

With reference now to FIG. 15A, a side view of a media drive attached to the present drive sled assembly and being inserted into a computer chassis is shown. Prior to insertion into drive bay 106, lever 201 is used to carry media drive 102. Thus, the drive sled assembly of the present invention provides an easy to use carrying handle for any media drive. Therefore, the present invention provides an apparatus and method which eliminates the awkwardness associated with handling or carrying media drives.

With reference still to FIG. 15A, during insertion into drive bay 106, lever 201 is in an upright position as shown. Left rail 204 and right rail 205 are slid over left drive guide 604 and right drive guide 605, respectively, as the present drive sled assembly attached to media drive 102 is pushed into computer chassis 501. In an embodiment where left and right rails are tapered, media drive 102 fits more snugly into drive bay 106 the farther media drive is pushed into drive bay 106.

Figure 15B:
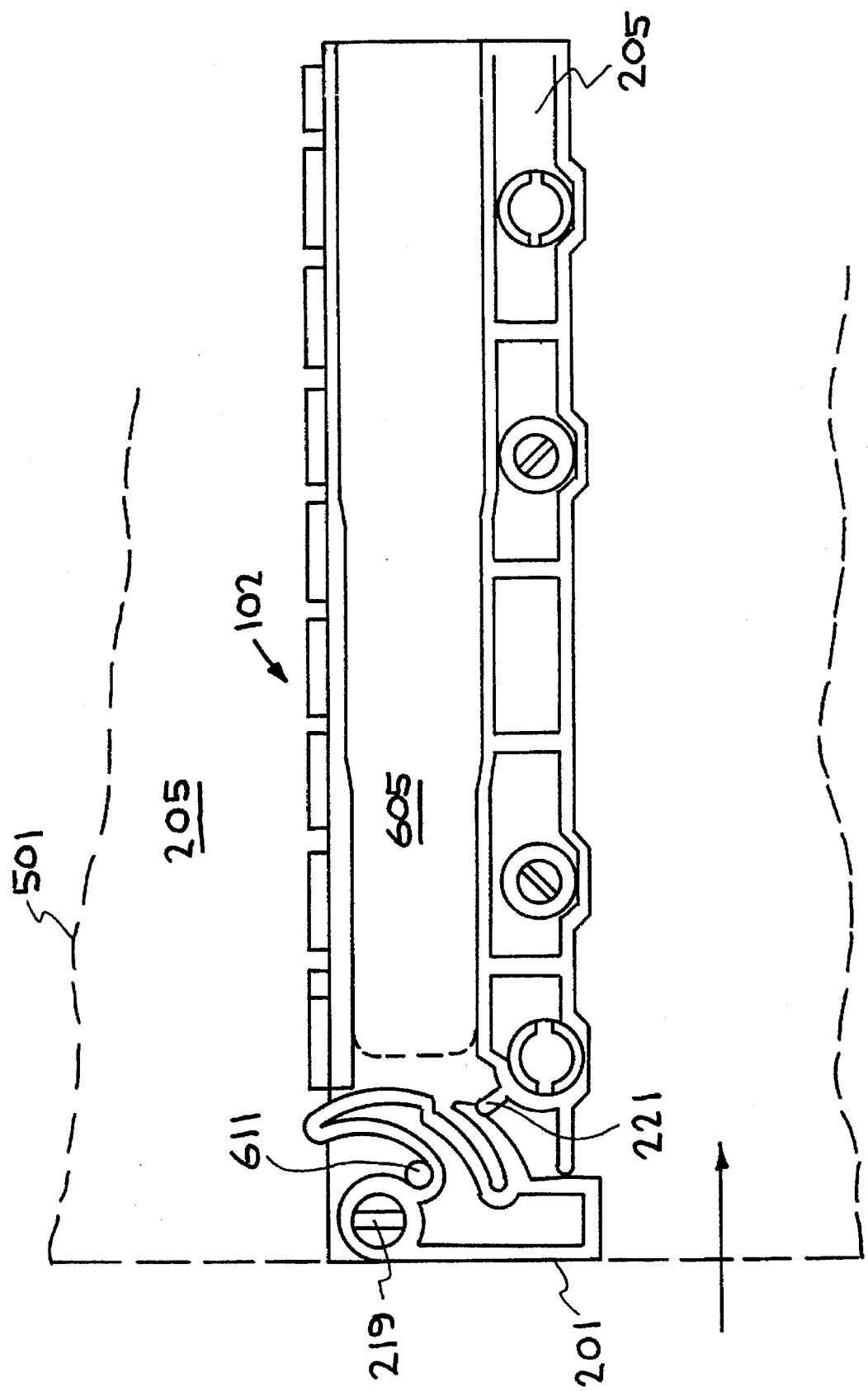
FIG. 15B is a side view of a media drive attached to the present drive sled assembly and fully inserted into a computer chassis in accordance with the present invention.

With reference now to FIG. 15B, a side view of a media drive attached to the present drive sled assembly and fully inserted into a computer chassis is shown. Once fully inserted into drive bay 106, media drive 201 is electrically coupled to power, address, and signal connections, not shown, residing along the back surface of computer chassis 501. By including adapter PCB assembly 208, the present invention provides easy electrical coupling to both SCA and non-SCA configured media drives. Once fully inserted into drive bay 106, media drive 201 is locked into computer chassis 501 by pushing lever 201 down as shown in FIG. 16B. Depressing lever 201 rotates right upper lever finger 214 around right chassis tab 611, and left upper lever finger 213 is rotated around left chassis tab 610. In so doing, media drive 201 is fully pressed into drive bay 106, and is locked within computer chassis 501. Thus, media drive 102 is prevented from moving inside computer chassis 501. Furthermore, once fully inserted into drive bay 106, light pipe 206 transmits LED signals from the back of computer chassis 501 to the front of computer chassis 501. In so doing, the LED signals are visible to a user of the media drive. Therefore, the present invention provides an apparatus and method for transferring LED signals from the back of a media drive to the front of a computer chassis without requiring the use of loose wires.

To remove media drive 102 from computer chassis 501, lever 201 is lifted, thereby disengaging right upper lever finger 214 from right chassis tab 611, and left upper lever finger 213 from left chassis tab 610. Lever 201 is then used to pull media drive 102 out of computer chassis 501. The present invention allows media drives to be installed and removed from computer chassis 501 without having to remove the computer cover, and without having to remove any drive screws. Thus, the present invention provides an apparatus and method which allows media drives to be interchangeably used in different computer chassis without requiring the removal of drive screws. Therefore, the present invention does not require handling or removing drive screws which are liable to fall on the motherboard.

Thus, the present invention provides an apparatus and method which allows media drives to be interchangeably used in different computer chassis without requiring the removal of drive screws. A further need exists for an apparatus and method to transfer LED signals from the back of a media drive to the front of a computer chassis without requiring the use of loose wires. A further need exists for an apparatus which eliminates the awkwardness associated with handling media drives.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A readily removable computer media drive sled assembly comprising:

drive guides adapted to be disposed within a computer media drive bay of a computer chassis; and a drive sled removably attached to a computer media drive, said drive sled movable along said drive guides within said computer media drive bay such that said computer media drive attached to said drive sled is removably insertable into said computer chassis said drive sled further comprised of:

rails adapted to be attached to a computer media drive, said rails configured to slide along said drive guides disposed within said computer media drive bay of said computer chassis such that said computer media drive attached to said rails is removably insertable into said computer chassis;

a front plate to be attached to said computer media drive, said front plate coupled to said rails;

a lever for carrying said drive sled and said media drive when said media drive is attached to said drive sled, said lever coupled to said front plate; and a light pipe coupled to said rails for transmitting light signals from the back of said computer chassis to the front of said computer chassis such that said light signals are visible from the front of said computer chassis.

2. A readily removable computer media drive sled assembly comprising:

drive guides adapted to be disposed within a computer media drive bay of a computer chassis; and a drive sled removably attachable to a computer media drive, said drive sled movable along said drive guides within said computer media drive bay such that said computer media drive attached to said drive sled is removably insertable into said computer chassis, said drive sled further comprising:

a light pipe coupled to said drive sled for transmitting light signals from the back of said computer chassis to the front of said computer chassis such that said light signals are visible from the front of said computer chassis.

3. A method for rendering a computer media drive removably insertable into a computer chassis comprising the steps of:

placing drive guides within a computer media drive bay of a computer chassis;

attaching a drive sled to a computer media drive, said drive sled movable along said drive guides within said computer media drive bay such that said computer media drive attached to said drive sled is removably insertable into said computer chassis; said step of attaching said drive sled to said computer media drive further comprising the steps of:

attaching rails to said computer media drive, said rails configured to slide along said drive guides disposed within said computer media drive bay of said computer chassis such that said computer media drive attached to said rails is removably insertable into said computer chassis;

attaching a front plate to said computer media drive, said front plate coupled to said rafts;

attaching a lever to said front plate, said lever for carrying said drive sled and said media drive when said media drive is attached to said drive sled; and coupling a light pipe coupled to said rails for transmitting light signals from the back of said computer chassis to the front of said computer chassis such that said light signals are visible from the front of said computer chassis.

* * * * *